US010163781B1

(12) United States Patent
Huang et al.

(10) Patent No.: US 10,163,781 B1
(45) Date of Patent: Dec. 25, 2018

(54) SEMICONDUCTOR DEVICES AND METHODS OF FORMING THE SAME

(71) Applicant: Taiwan Semiconductor Manufacturing Co., Ltd., Hsinchu (TW)

(72) Inventors: Hon-Lin Huang, Hsinchu (TW); Chen-Shien Chen, Hsinchu County (TW); Chin-Yu Ku, Hsinchu (TW); Kuan-Chih Huang, Tainan (TW); Wei-Li Huang, Pingtung County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/798,422

(22) Filed: Oct. 31, 2017

Related U.S. Application Data

(60) Provisional application No. 62/512,735, filed on May 31, 2017.

(51) Int. Cl.
*H01L 23/522* (2006.01)
*H01L 21/768* (2006.01)
*H01L 49/02* (2006.01)
*H01L 23/31* (2006.01)

(52) U.S. Cl.
CPC .... *H01L 23/5227* (2013.01); *H01L 21/76832* (2013.01); *H01L 28/10* (2013.01); *H01L 23/3171* (2013.01)

(58) Field of Classification Search
CPC .... H01L 23/5227; H01L 23/645; H01L 28/10
See application file for complete search history.

(56) References Cited

U.S. PATENT DOCUMENTS

| 6,391,713 | B1 | 5/2002 | Hsue et al. |
| 7,381,658 | B2 | 6/2008 | Mardilovich et al. |
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,874 | B2 | 6/2015 | Edelstein et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |

(Continued)

OTHER PUBLICATIONS

Office Action of Taiwan Counterpart Application, dated Aug. 16, 2018, pp. 1-4.

*Primary Examiner* — Daniel P Shook
(74) *Attorney, Agent, or Firm* — JCIPRNET

(57) ABSTRACT

Semiconductor devices and methods of forming the same are disclosed. One of the semiconductor devices includes a conductive layer, a first dielectric layer, a magnetic layer and an etch stop stack. The first dielectric layer is disposed over the conductive layer. The magnetic layer is disposed over the first dielectric layer. The etch stop stack is disposed between the magnetic layer and the first dielectric layer. The etch stop stack includes a second dielectric layer and a plurality of unit layers between the second dielectric layer and the magnetic layer, and each of the plurality of unit layers comprises a tantalum layer and a tantalum oxide layer on the tantalum layer.

20 Claims, 11 Drawing Sheets

(56) References Cited

U.S. PATENT DOCUMENTS

2009/0283736 A1 11/2009 Kanzawa et al.
2011/0272664 A1 11/2011 Tada et al.
2012/0104505 A1* 5/2012 Henson ............. H01L 21/31111
                                                    257/369

\* cited by examiner

SEMICONDUCTOR DEVICES AND METHODS OF FORMING THE SAME

CROSS-REFERENCE TO RELATED APPLICATION

This application claims the priority benefit of U.S. provisional application Ser. No. 62/512,735, filed on May 31, 2017. The entirety of the above-mentioned patent application is hereby incorporated by reference herein and made a part of this specification.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements thereon.

Generally, an inductor is a passive electrical component that can store energy in a magnetic field created by an electric current passing through it. Inductors may be utilized in a wide variety of applications. However, there are many challenges related to inductors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
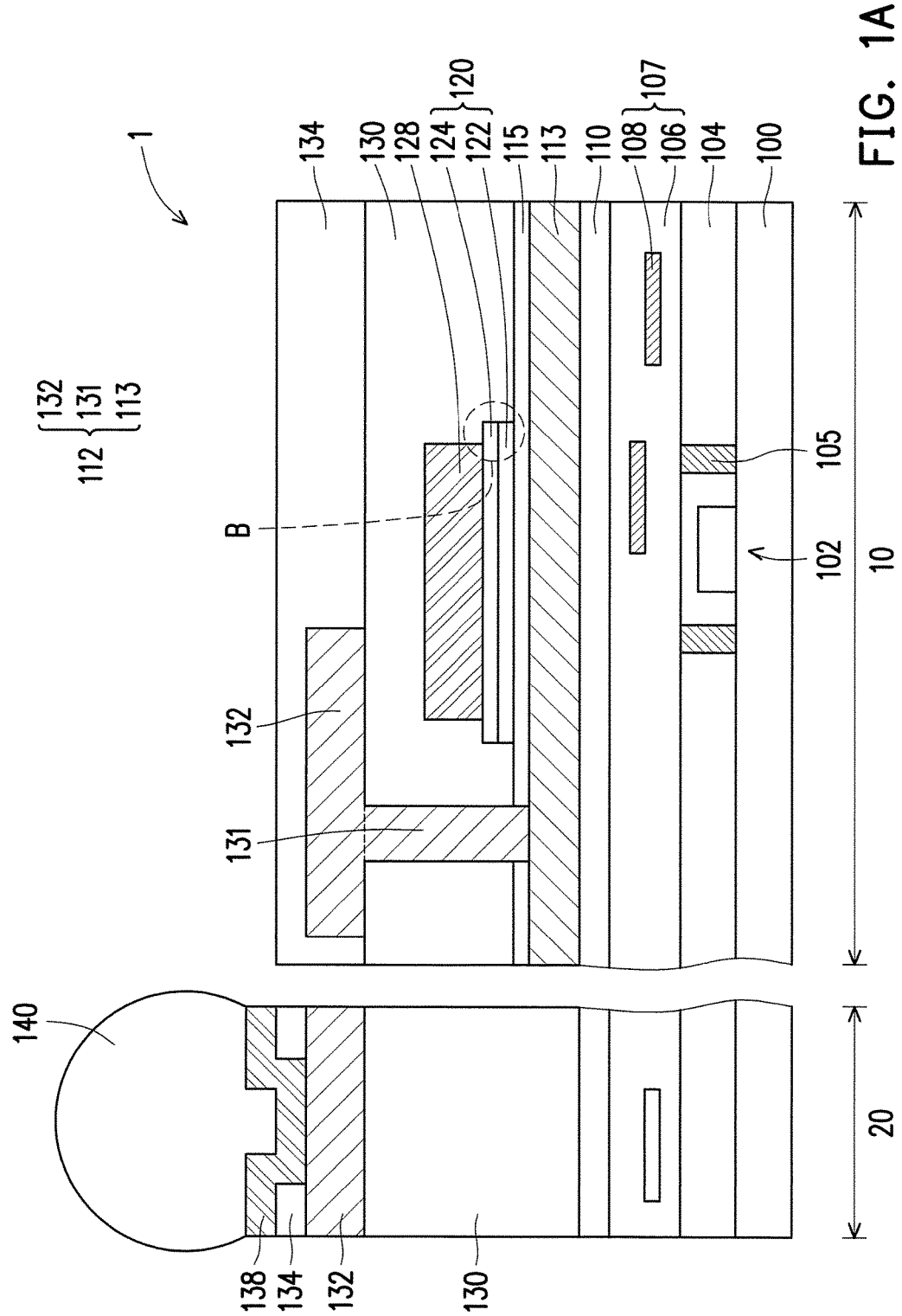
FIG. 1A is a schematic cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
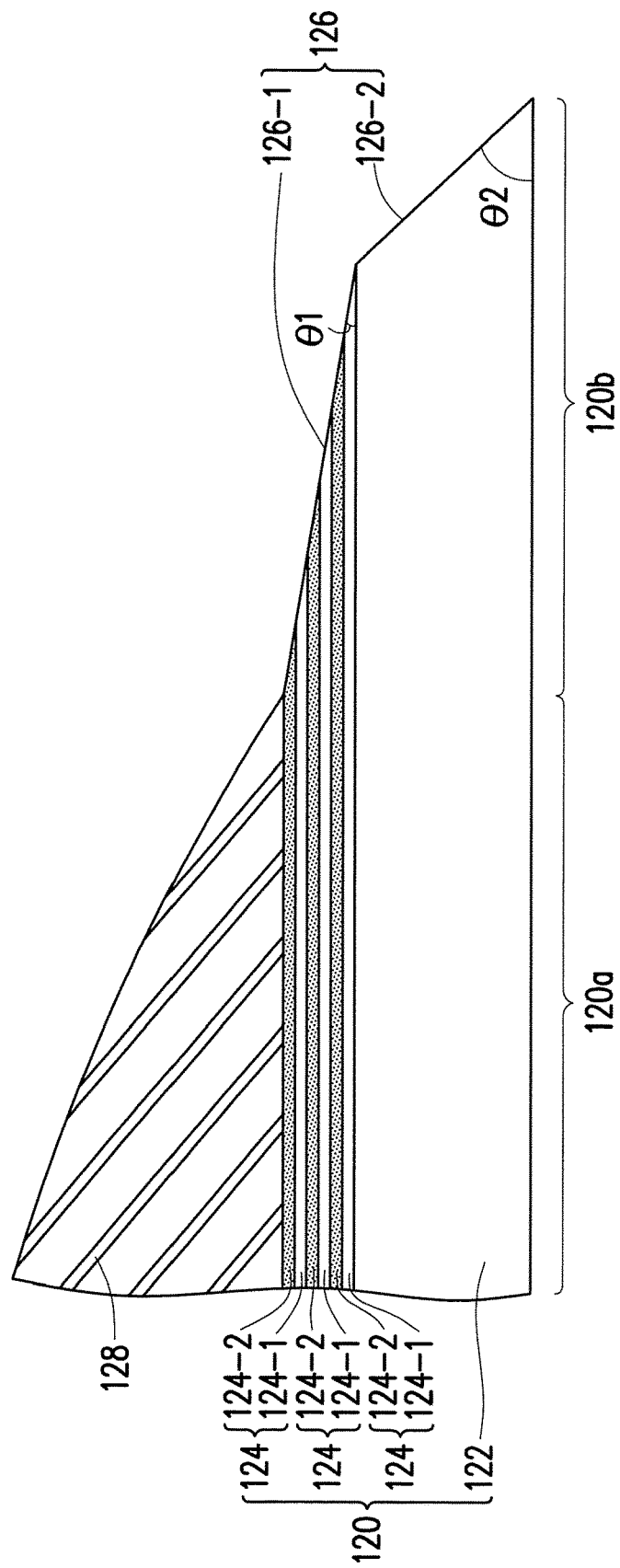
FIG. 1B is an enlarged view of an indicated portion B of FIG. 1A.

FIG. 1A is a schematic cross-sectional view of a semiconductor device in accordance with some embodiments, and FIG. 1B is an enlarged view of an indicated portion B of FIG. 1A.

Referring to FIG. 1A, a substrate 100 is provided. In some embodiments, the substrate 100 is a semiconductor substrate, such as a silicon substrate, a silicon-on-insulator (SOI) substrate, a silicon germanium substrate, or a substrate formed of other suitable semiconductor materials. Depending on the requirements of design, the substrate 100 may be a P-type substrate or an N-type substrate and may have doped regions therein.

The substrate 100 may have a first area 10 and a second area 20 adjacent to the first area 10. In some embodiments, the first area 10 is an area where a semiconductor structure is formed, and the second area 20 is a package area configured to bond the semiconductor structure to an application specific integrated circuit (ASIC). In some embodiments, the second area 20 provides an electrical connection where an electrical connector (e.g., a ball/bump) may be placed.

An electrical circuit 102 is formed on the substrate 100 in the first area 10. In some embodiment, the electrical circuit 102 includes gate stacks formed by dielectric layers and electrode layers. The dielectric layers may include an interfacial layer (IL) and a high-k layer having a dielectric constant greater than about 4, greater than about 8 or even greater than about 10. The dielectric layers are deposited by suitable techniques, such as chemical vapor deposition (CVD), atomic layer deposition (ALD), physical vapor deposition (PVD), thermal oxidation, a combination thereof, or the like. The electrode layers may include a single layer or multiple layers, such as a metal layer, a liner layer, a wetting layer, an adhesion layer, a combination thereof, or the like, and may be formed by ALD, PVD, CVD or the like.

An inter-layer dielectric (ILD) layer 104 is formed over the substrate 100 in the first and second areas 10 and 20. In some embodiments, the ILD layer 104 covers the electrical circuit 102. In some embodiments, the ILD layer 104 includes a low-k dielectric material having a dielectric constant less than about 4, less than about 3.5 or even less than about 3. The low-k material includes phosphosilicate glass (PSG), borophosphosilicate glass (BPSG), fluorinated silicate glass (FSG), silicon oxycarbide ($SiO_xC_y$), Spin-On-Glass (SOG), Spin-On-Polymer (SOP), a combination thereof, or the like. The ILD layer 104 may be formed by a suitable method, such as spinning, CVD or plasma-enhanced CVD (PECVD). The ILD layer 104 may have a single-layer or multi-layer structure.

Contacts 105 are formed through the ILD layer 104 to provide electrical contacts to the electrical circuit 102. In some embodiments, openings are formed in the ILD layer 104 by photolithography and etching processes. The openings may be lined with a diffusion barrier layer and/or an adhesion layer (not shown), and filled with a conductive material. In some embodiments, the diffusion barrier layer includes TaN, Ta, TiN, Ti, CoW, a combination thereof, or the like, and the conductive material includes copper, tungsten, aluminum, silver, a combinations thereof, or the like.

An interconnect structure 107 is formed over the substrate 100 in the first and second areas 10 and 20. In some embodiments, the interconnect structure 107 is formed on the ILD layer 104. In some embodiments, the interconnect structure 107 includes one or more inter-metal dielectric (IMD) layers 106 and the associated metallization features 108 (e.g., metal layers and vias) embedded in the IMD layers 106. Generally, the one or more IMD layers 106 and the associated metallization features 108 are used to interconnect the electrical circuit 102 to each other and to provide an external electrical connection. The IMD layers 106 include a low-k dielectric material having a dielectric constant less than about 4, less than about 3.5 or even less than about 3. The low-k material includes PSG, BPSG, FSG, $SiO_xC_y$, SOG, SOP, a combination thereof, or the like. In some embodiments, the IMD layers 106 is formed by a suitable method, such as spinning, CVD or PECVD.

In some embodiments, one or more insulating etch stop layers (not shown) may be positioned between adjacent ones of the dielectric layers, e.g., the ILD layer 104 and the IMD layers 106. The insulating etch stop layers are formed of a dielectric material having a different etch selectivity from adjacent layers. In some embodiments, the insulating etch stop layers may be formed of SiN, SiCN, SiCO, a combination thereof, or the like, and may be formed by a suitable method, such as CVD or PECVD.

A passivation layer 110 is formed over the substrate 100 in the first and second areas 10 and 20. In some embodiments, the passivation layer 110 is formed on the IMD layers 106. In some embodiments, the passivation layer 110 may be formed of a dielectric material, such as SiN, a plasma-enhanced oxide (PEOX), a plasma-enhanced SiN (PE-SiN), plasma-enhanced undoped silicate glass (PE-USG), a high density plasma (HDP) chemical vapor deposition (CVD) oxide, a combination thereof, or the like. The passivation layer 110 is formed to protect the underlying layers from various environmental contaminants.

A semiconductor structure 1 is then formed on the substrate 100 in the first area 10. In some embodiments, the semiconductor structure 1 may be an inductor structure 1, and includes a post-passivation interconnect (PPI) structure 112 over the substrate 100 and a magnetic layer 128, for example. In some embodiments, the PPI structure 112 is a spiral, and the magnetic layer 128 is disposed in a central region of the spiral, for example.

In some embodiments, the PPI structure 112 includes aluminum, copper or a copper alloy. In some embodiments, the PPI structure 112 may be formed by an electro-plating process. In alternative embodiments, the PPI structure 112 may include a copper layer coated with electro-less nickel electro-less palladium immersion gold (ENEPIG), which includes a nickel layer, a palladium layer on the nickel layer, and a gold layer on the palladium layer. The gold layer may be formed using immersion plating. In yet alternative embodiments, other conductive materials may be used to form the PPI structure 112.

In some embodiments, the PPI structure 112 includes a first conductive layer 113, a second conductive layer 132 and a via 131 therebetween. Specifically, the second conductive layer 132 is electrically connected to the first conductive layer 113 through the via 131, and the first conductive layer 113, the via 131 and the second conductive layer 132 constitute a spiral structure (not shown).

In some embodiments, the semiconductor structure 1 includes the first conductive layer 113, a dielectric layer 115, an etch stop stack 120, the magnetic layer 128, a dielectric layer 130 and the second conductive layer 132. The first conductive layer 113 is over the passivation layer 110. The dielectric layer 115 is formed over the first conductive layer 113. The magnetic layer 128 is over the dielectric layer 115. The etch stop stack 120 is between the dielectric layer 115 and the magnetic layer 128. The dielectric layer 130 is over the first conductive layer 113 and encapsulates the magnetic layer 128, the etch stop stack 120 and the dielectric layer 115. The second conductive layer 132 is over the dielectric layer 130.

In some embodiments, the etch stop stack 120 includes a plurality of tantalum layers (Ta layers) 124-1 and a plurality of tantalum oxide layers (TaO layers) 124-2. In some embodiments, the etch stop stack 120 includes a dielectric layer 122 and a plurality of unit layers 124 between the dielectric layer 122 and the magnetic layer 128, and each of the unit layers 124 includes the Ta layer 124-1 and the TaO layer 124-2 on the Ta layer 124-1. In some embodiments, the Ta layers 124-1 and the TaO layers 124-2 are disposed alternatively from bottom to top. In some embodiments, the lowermost Ta layer 124-1 of the etch stop stack 120 is adjacent to and in physical contact with the dielectric layer 122. The topmost TaO layer 124-2 of the etch stop stack 120 is adjacent to and in physical contact with the magnetic layer 128. However, the present disclosure in not limited thereto. In alternative embodiments, the Ta layers 124-1 and the TaO layer 124-2 may have other arrangement, for example, the lowermost layer of the etch stop stack 120 may be the TaO layer 124-2, or the topmost layer of the etch stop stack 120 may be the Ta layer 124-1. In addition, the total number of the Ta layers 124-1 and the TaO layer 124-2 may be odd. Furthermore, in alternative embodiments, the etch stop stack 120 may consist of the Ta layers 124-1 and the TaO layers 124-2, that is, the dielectric layer 122 is omitted.

In some embodiments, the unit layers 124 are formed by a suitable method, such as performing a plurality of cycles, and each cycle includes forming the Ta layer 124-1 and performing an oxidation process on the Ta layer 124-1 to form the TaO layer 124-2. For example, three unit layers 124 are formed by performing three cycles of forming the Ta layer 124-1 and performing an oxidation process on the Ta layer 124-1 to form the TaO layer 124-2. In other words, a top portion of the Ta layer 124-1 is oxidized to form the TaO layer 124-2. In some embodiments, the Ta layer 124-1 may be formed by a suitable method, such as CVD or PECVD, and the oxidation process is a thermal oxidation process. In some alternative embodiments, the Ta layer 124-1 may be formed by a deposition process such as CVD or PECVD. In some embodiments, the dielectric layer 122 includes SiN, SiC, SiCN, SiCO, SiON, $SiO_x$, nitrogen-oxide-nitrogen (NON), oxide-nitrogen-oxide (ONO) or a combination thereof, or the like, and may be formed by a suitable method, such as CVD or PECVD. In some embodiments, the etch selectivity of the magnetic layer 128 to the etch stop stack 120 ranges from about 1:10 to 1:300.

In some embodiments, a thickness ratio of the Ta layer 124-1 and the TaO layer 124-2 is 1:1 to 4:1. In some embodiments, a thickness ratio of the unit layers 124 and the dielectric layer 122 ranges from about 50:1 to 1.67:1. In some embodiments, a total thickness of the unit layers 124 ranges from about 100 angstroms to 600 angstroms. If the TaO layer 124-2 is too thick (i.e., the thickness ratio less than 1:1), cracking of the etch stop stack 120 or the delamination of the etch stop stack 120 form the underlying layer may occur. If the TaO layer 124-2 is too thin (i.e., the thickness ratio larger than 4:1), the TaO layer 124-2 fails to function as an etch stop layer. In some embodiments, a thickness of the dielectric layer 122 ranges from about 1000 angstroms to 5000 angstroms. If the thickness of the dielectric layer 122 is out of the above range, the delamination of the etch stop stack 120 form the underlying layer may occur. In some embodiments, the dimension of the etch stop stack 120 is greater than the magnetic layer 128, as shown in FIG. 1A. However, the present disclosure in not limited thereto. In alternative embodiments, the dimension of the etch stop stack 120 can be equal to or less than the magnetic layer 128.

For the sake of simplicity and clarity, the etch stop stack 120 in FIG. 1A is illustrated as having three unit layers 124. Such etch stop stack 120 including three unit layers 124 is merely an example of the etch stop stack 120. In other words, the number of unit layers 124 of the etch stop stack 120 is not limited by the embodiments of the disclosure. It should be appreciated by those skilled in the art that the number of unit layers 124 can be adjusted upon the process requirements.

Referring to FIGS. 1A and 1B, in some embodiments, the etch stop stack 120 includes a center section 120a and an edge section 120b connected to and surrounding the center section 120a. The center section 120a is overlapped with the magnetic layer 128, and the edge section 120b is protruded from the magnetic layer 128 and has an inclined sidewall 126. In some embodiments, the center section 120a is contact with the magnetic layer 128 and substantially has a uniform thickness. In some embodiments, the edge section 120b is like a tail with a gradually decreasing thickness. In some embodiments, the included angle θ1 between a bottom surface of the unit layers 124 and a line tangent to the inclined sidewall 126-1 of the unit layers 124 ranges from about 10 degrees to 60 degrees. The included angle θ2 between a bottom surface of the dielectric layer 122 and a line tangent to the inclined sidewall 126-2 of the dielectric layer 122 ranges from about 20 degrees to 90 degrees. In some embodiments, the included angle θ1 is substantially less than the included angle θ2, as shown in FIG. 1B. However, the present disclosure in not limited thereto. In alternative embodiments, the included angle θ1 can be equal to or greater than the included angle θ2. In addition, although the included angle θ1 in FIG. 1B is formed by the bottom surface and the sidewall of the bottommost Ta layer 124-1, the included angle θ1 is substantially formed by the bottom surface of the bottommost Ta layer 124-1 and at least one sidewall of the Ta layers 124-1 and the TaO layers 124-2 disposed on the bottommost Ta layer 124-1.

In some embodiments, the magnetic layer 128 includes a magnetic metal material containing cobalt (Co), zirconium (Zr), tantalum (Ta) and niobium (Nb), rhenium (Re), neodymium (Nd), praseodymium (Pr), dysprosium (Dy) or a combination thereof. In some embodiments, the magnetic layer 128 includes an amorphous cobalt (Co) alloy including cobalt (Co) and zirconium (Zr). Zirconium (Zr) helps to make cobalt (Co) amorphous. In some embodiments, magnetic layer 128 includes a cobalt-zirconium (CoZr) alloy having one or more additional elements, such as tantalum (Ta) and niobium (Nb). In some other embodiments, magnetic layer 128 includes a cobalt-zirconium (CoZr) alloy having one or more additional elements, such as a rare earth element, that helps to increase the ferromagnetic resonance of the cobalt-zirconium (CoZr) alloy. The rare earth element include rhenium (Re), neodymium (Nd), praseodymium (Pr), or dysprosium (Dy). In some embodiments, the magnetic layer 128 includes CoZrTa, CoZr, CoZrRe, NiFe or a combination thereof. The magnetic layer 128 may be formed by a suitable method such as PVD, CVD or the like.

The magnetic layer 128 is insulated from the PPI structure 112 by the dielectric layer 130, the dielectric layer 115 and the etch stop stack 120. In some embodiments, the dielectric layer 115 is disposed between the bottom of the etch stop stack 120 and the first conductive layer 113. In some embodiments, the dielectric layer 115 includes silicon oxide, silicon nitride, silicon oxynitride or a combination thereof. The dielectric layer 115 may be formed by a suitable method such as CVD, ALD, PVD, thermal oxidation or the like. In some embodiments, the dielectric layer 130 encapsulates the sidewall and the top of the magnetic layer 128. In some embodiments, the dielectric layer 130 further encapsulates the sidewall of the etch stop stack 120. In some embodiments, the dielectric layer 130 may be formed of a polymer such as an epoxy, polyimide, benzocyclobutene (BCB), polybenzoxazole (PBO) or the like. The dielectric layer 130 may be formed by a suitable method such as spin-coating, lamination, deposition or the like.

In some embodiments, another dielectric layer 134 is further included in the semiconductor structure 1. The dielectric layer 134 is formed on the dielectric layer 130 and encapsulates the second conductive layer 132. In some embodiments, the dielectric layer 134 may be formed of a polymer such as an epoxy, polyimide, benzocyclobutene (BCB), polybenzoxazole (PBO) or the like. The material of the dielectric layer 134 can be the same as or different from that of the dielectric layer 130. The dielectric layer 134 may be formed by a suitable method such as spin-coating, lamination, deposition or the like.

In some embodiments, after the semiconductor structure 1 is formed in the first area 10, an under bump metallization (UBM) layer 138 and a bump 140 are formed over the substrate 100 in the second area 20.

In some embodiments, the dielectric layer 130 is further formed on the substrate 100 in the second area 20. In some embodiments, while the second conductive layer 132 is formed on the dielectric layer 130 in the first area 10, the second conductive layer 132 may be formed as a connecting pad at an end of the spiral structure in the second area 20, for example. Besides, the dielectric layer 134 is further formed on the second conductive layer 132 in the second area 20.

The UBM layer 138 is formed over and electrically connected to the connecting pads. In some embodiments, the UBM layer 138 includes copper, nickel, titanium, a combination thereof, or the like, and is formed by an electroplating process. The bump 140 is formed over and electrically connected to the UBM layer 138. In some embodiments, the bump 140 includes a conductive material with low resistivity, such as Sn, Pb, Ag, Cu, Ni, Bi or an alloy thereof, and may be formed by a suitable process such as evaporation, plating, ball drop, or screen printing. A semiconductor device including the semiconductor structure 1 and the bump 140 is thus completed.

The method of forming a semiconductor structure including an etch stop stack will be described in details below with reference to FIG. 2A to FIG. 2H. FIG. 2A to FIG. 2H are schematic cross-sectional views of a method of forming a semiconductor structure in accordance with some embodiments.

Figure 2A:
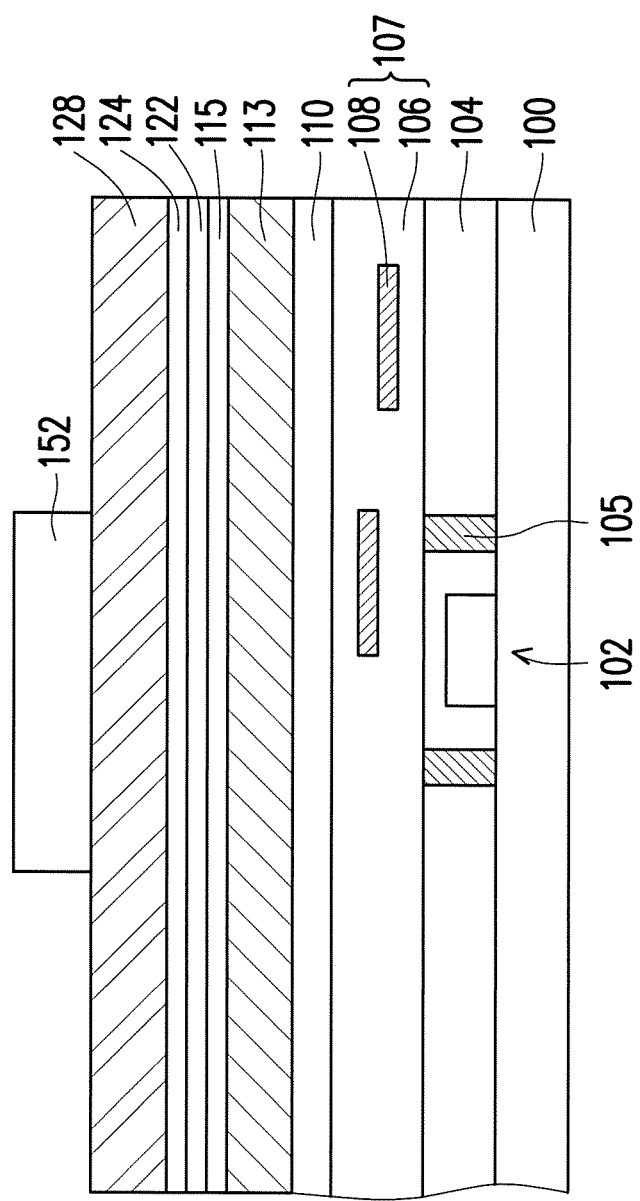
FIG. 2A to FIG. 2H are schematic cross-sectional views of a method of forming a semiconductor structure in accordance with some embodiments.
Figure 3:
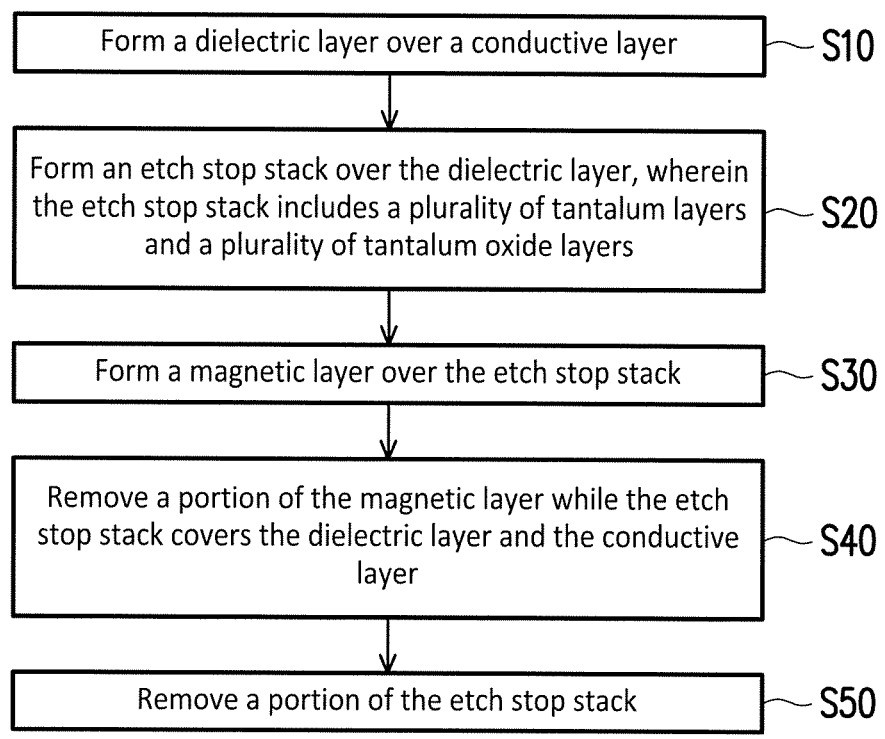
FIG. 3 is a flowchart showing a method of forming a semiconductor device in accordance with some embodiments of the disclosure.

Referring to FIGS. 2A and 3, in Step S10, a dielectric layer 115 is formed over a first conductive layer 113. In some embodiments, a substrate 100 is provided with an electrical circuit 102, contacts 105, an interconnect structure 107 and a passivation layer 110 thereon. Thereafter, the first conductive layer 113 is formed on the passivation layer 110, and the dielectric layer 115 is formed on the first conductive layer 113. The materials, dispositions and forming methods of these elements have been described above, and the details are not iterated herein.

Afterwards, in Step S20, an etch stop stack 120 is formed over the dielectric layer 115, wherein the etch stop stack 120 includes a plurality of tantalum layers 124-1 and a plurality of tantalum oxide layers 124-2. In detail, a dielectric layer 122 is blanket-formed on the first conductive layer 113 and the dielectric layer 115, and then a plurality of unit layers 124 is blanket-formed on the dielectric layer 122. In some embodiments, each unit layer 124 includes, from bottom to top, the Ta layer 124-1 and the TaO layer 124-2. The materials and forming methods of the dielectric layer 122 and the unit layers 124 have been described above, and the details are not iterated herein.

Then, in Step S30, a magnetic layer 128 is formed over the etch stop stack 120. In some embodiments, the magnetic layer 128 is blanket-formed on the dielectric layer 115 with the unit layers 124 interposed therebetween. The material and forming method of the magnetic layer 128 have been described above, and the details are not iterated herein.

Continue referring to FIG. 2A, a first photolithography step is performed to form a first photoresist layer 152 on the magnetic layer 128. In some embodiments, the method of forming the first photoresist layer 152 includes coating a photoresist material on the magnetic layer 128, exposing the photoresist material with a photolithography mask (or called photomask), and developing the exposed photoresist material. In some embodiments, the first photoresist layer 152 includes a positive photoresist material which is photo-solubilized when exposed to light. In alternative embodiments, the first photoresist layer 152 includes a negative photoresist material.

Figure 2B:
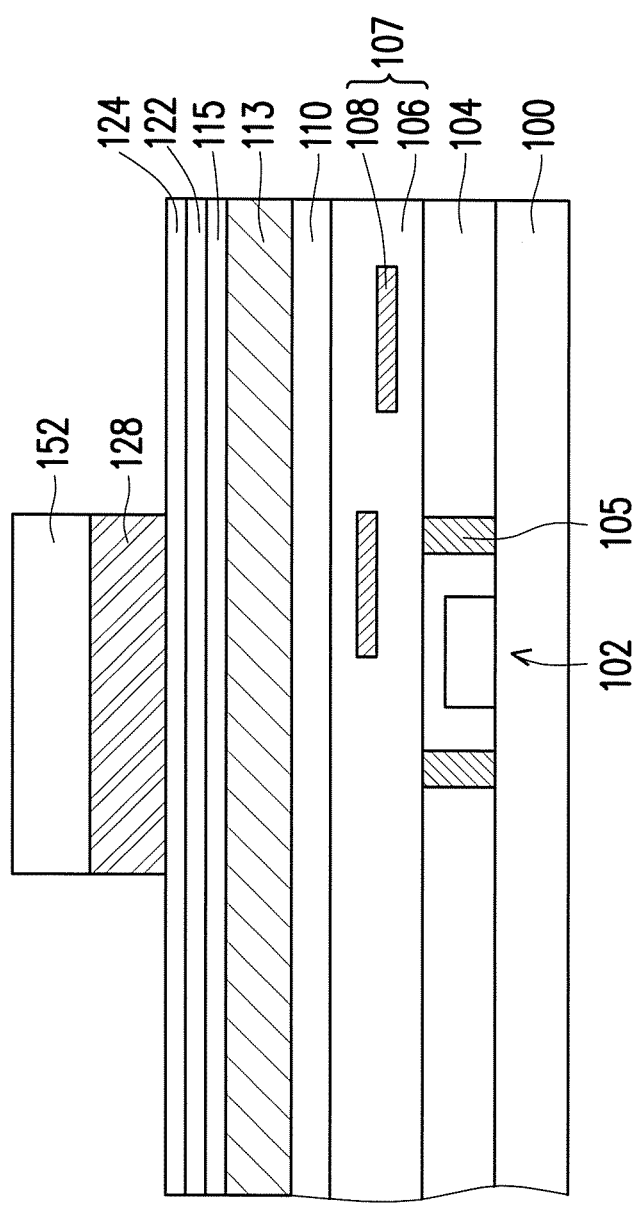
Figure 2C:
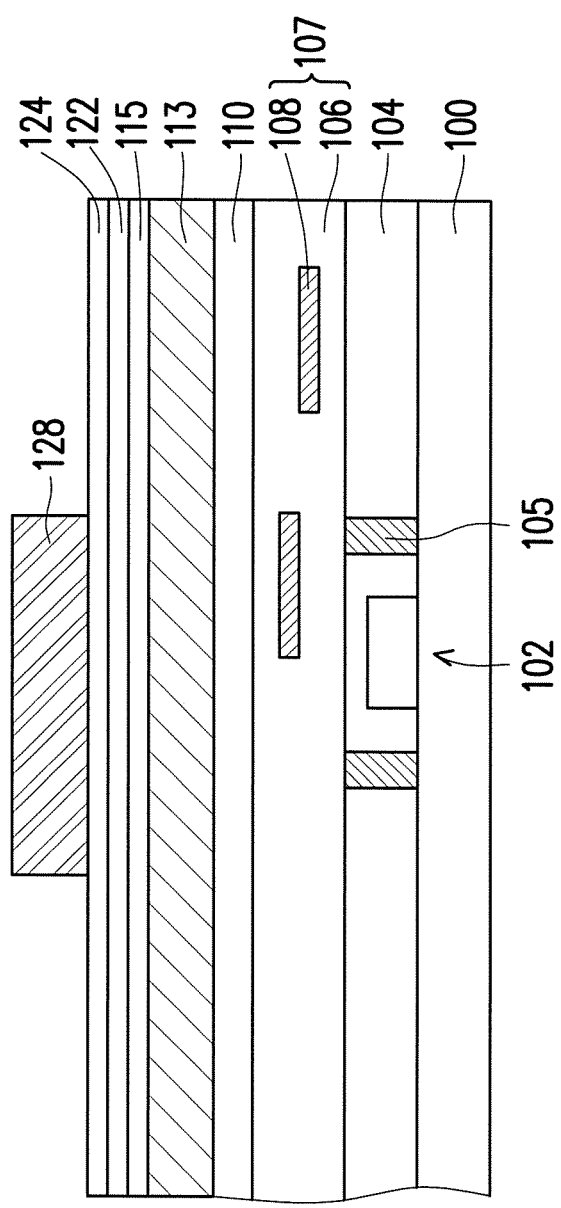

Referring to FIGS. 2B, 2C and 3, in Step S40, a portion of the magnetic layer 128 is removed while the etch stop stack 120 covers the dielectric layer 115 and the first conductive layer 113. In some embodiments, a first etching step is performed to the magnetic layer 128 by using the first photoresist layer 152 as an etch mask, so the magnetic layer 128 is patterned. In some embodiments, the first etching step is a wet etching process used to partially remove the magnetic layer 128. In some embodiments, an etching solution used in the first etching step includes an acid solution containing $HNO_3$, HCl, $H_2O_2$, HF or a combination thereof. In some embodiments, the etching solution includes $HNO_3$, HCl and $H_2O_2$. In alternative embodiments, the etching solution includes HF, $HNO_3$ and water.

In some embodiments, as shown in FIG. 2B, by providing the first photoresist layer 152, the magnetic layer 128 is patterned, while the dielectric layer 115 remains substantially intact. After the magnetic layer 128 is patterned, the first photoresist layer 152 is removed, as shown in FIG. 2C.

Figure 2D:
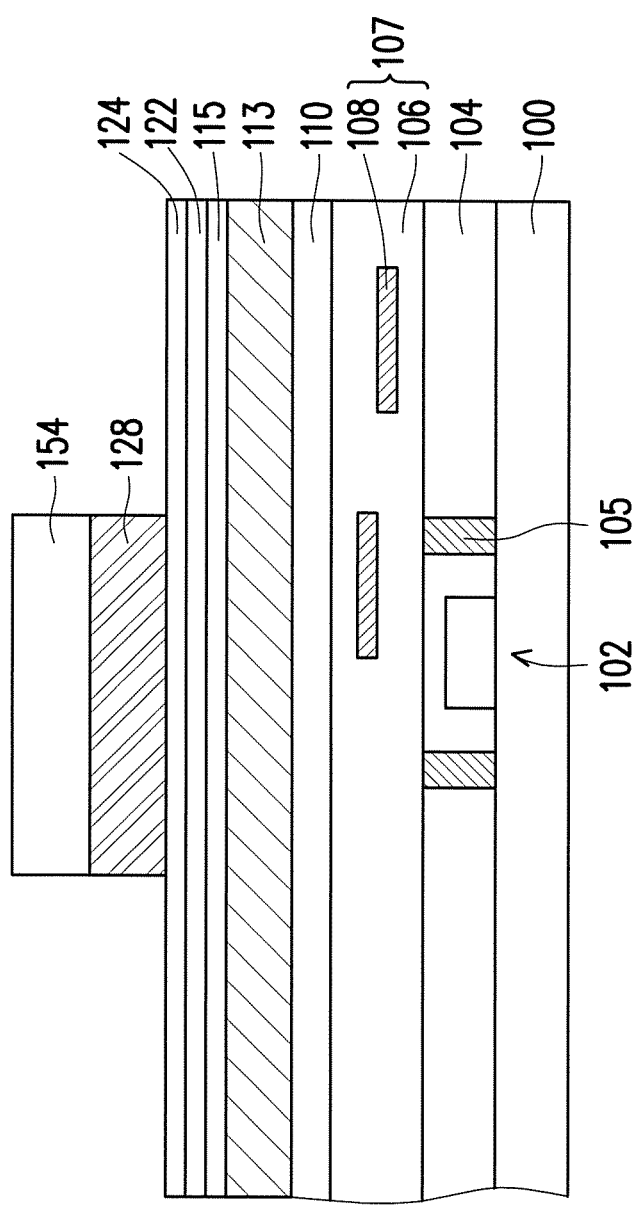

Referring to FIG. 2D, a second photolithography step is performed to form a second photoresist layer 154 that covers the magnetic layer 128 and exposes the etch stop stack 120. In some embodiments, the method of forming the second photoresist layer 154 includes coating a photoresist material on the magnetic layer 128, exposing the photoresist material with a photolithography mask, and developing the exposed photoresist material. In some embodiments, the second photoresist layer 154 includes a positive photoresist material which is photo-solubilized when exposed to light. In alternative embodiments, the second photoresist layer 154 includes a negative photoresist material.

In some embodiments, the first and second photoresist layers 152 and 154 are defined with the same photolithography mask. In some embodiments, the photolithography recipe for the second photolithography step is the same as that for the first photolithography step. That is, the first and second photolithography steps are performed using the same process parameters. For example, the first and second photolithography steps are performed using the same photoresist material, the same photolithography mask, the same exposure energy and the same development time. In alternative embodiments, at least one of the process parameters is different in the first and second photolithography steps.

Figure 2E:
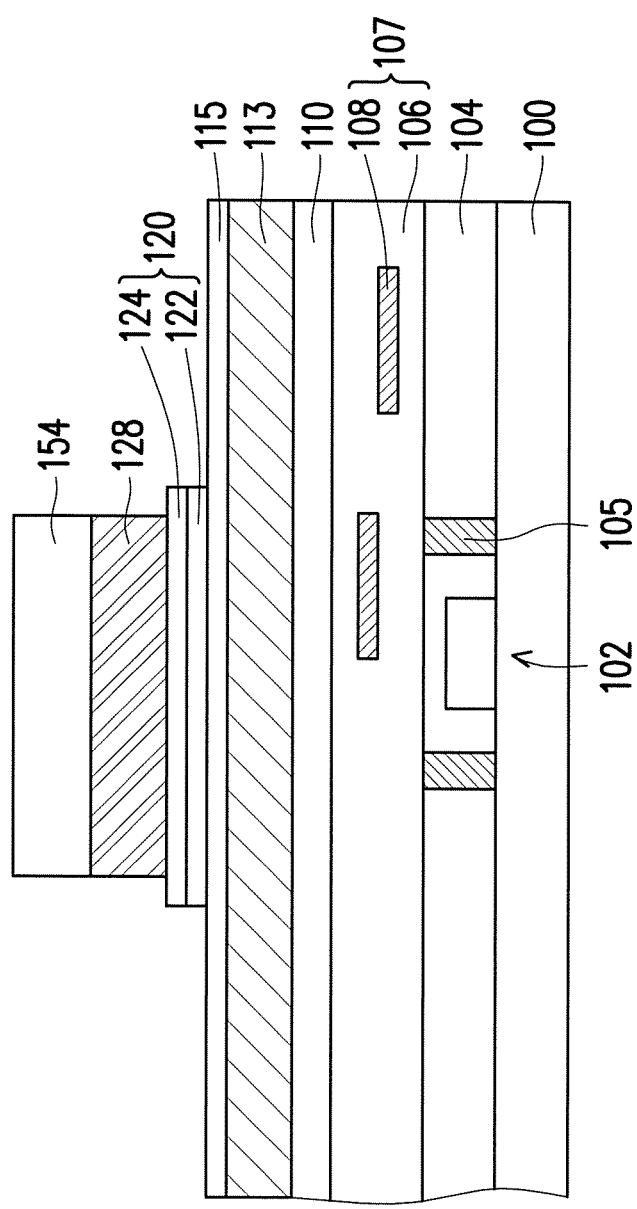
Figure 2F:
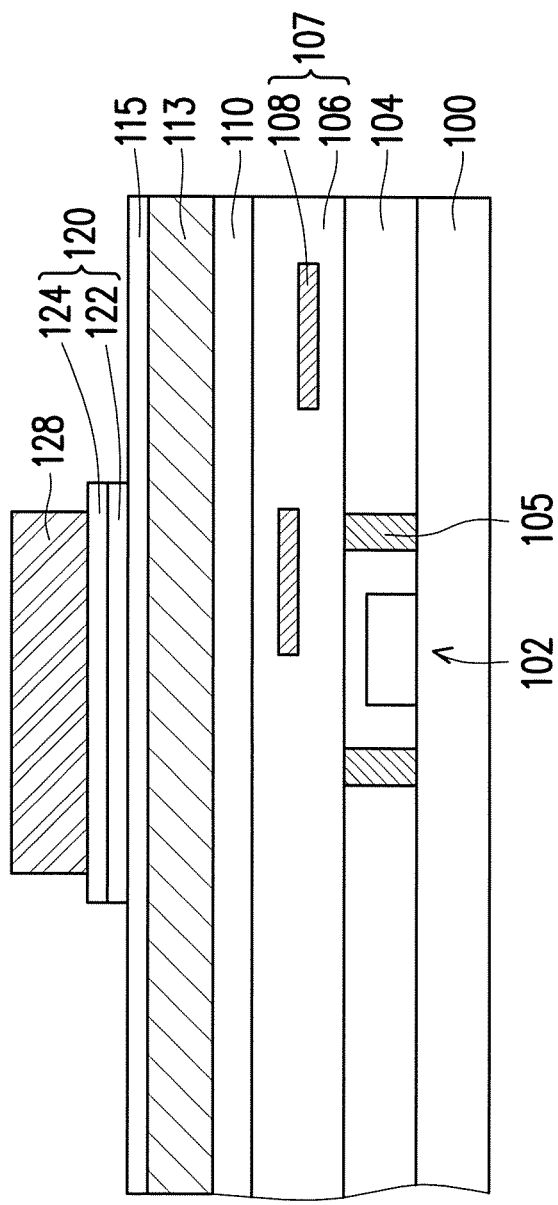

Referring to FIGS. 2E, 2F and 3, a portion of the etch stop stack 120 is removed. In some embodiments, a second etching step is performed to the etch stop stack 120 by using the second photoresist layer 154 and the magnetic layer 128 as an etch mask, so the etch stop stack 120 is patterned. In some embodiments, the second etching step is a dry etching step. In some embodiments, an etchant used in the second etching step includes carbon fluoride $C_xF_y$, such as $CF_4$ or other suitable etchant. In some embodiments, the dimension of the etch stop stack 120 is greater than the magnetic layer 128, for example. After the etch stop stack 120 is patterned, the second photoresist layer 154 is removed, as shown in FIG. 2F.

Figure 2G:
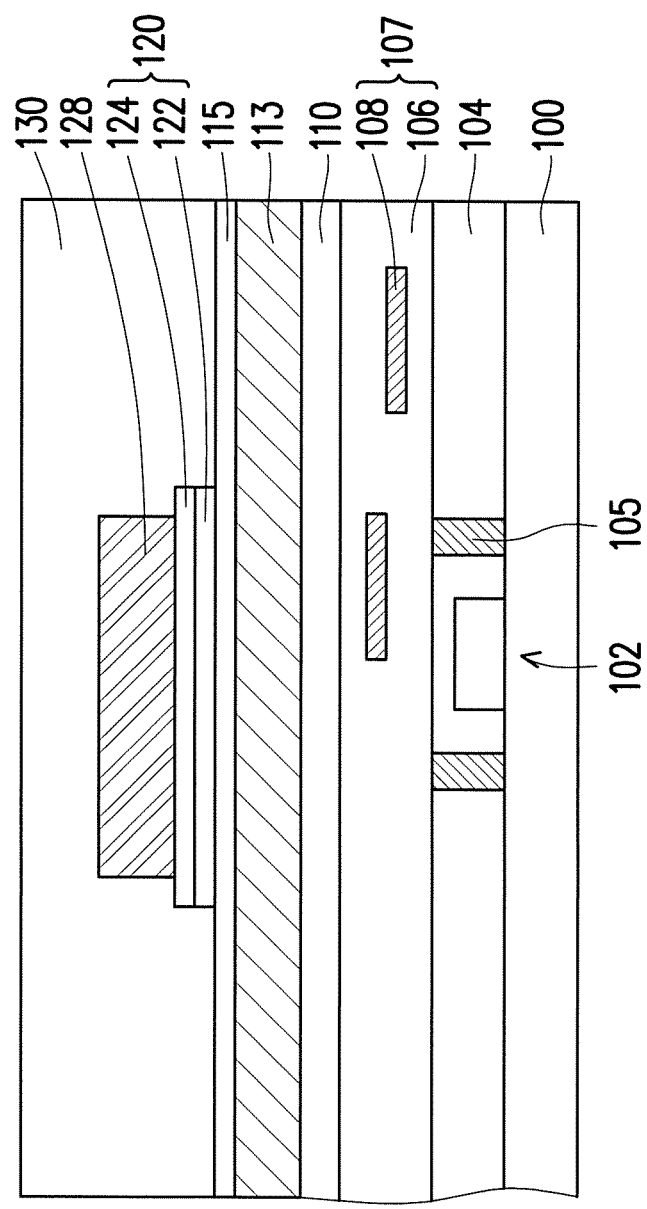

Referring to FIG. 2G, a dielectric layer 130 is formed over the substrate 100 and covers the magnetic layer 128 and the etch stop stack 120.

Figure 2H:
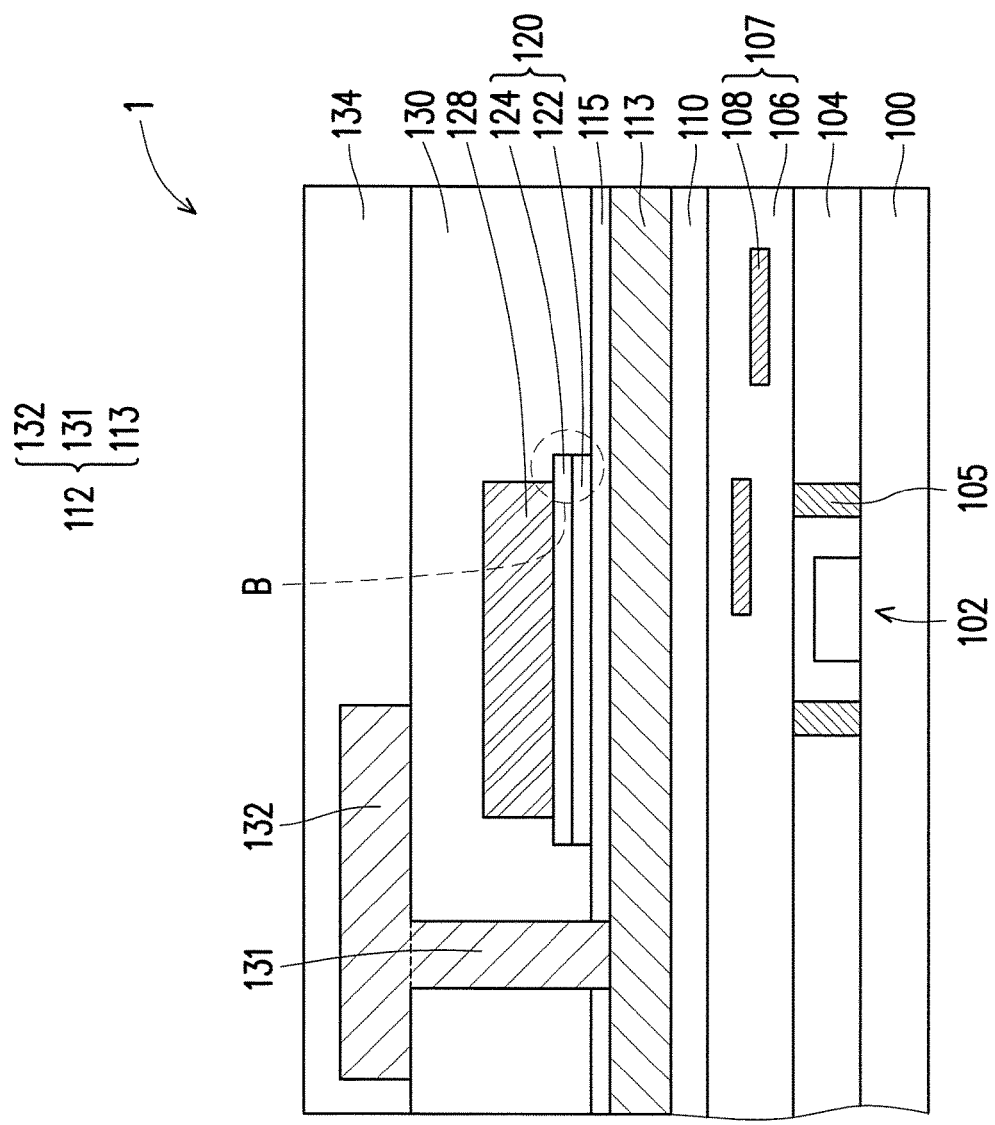

Referring to FIG. 2H, a second conductive layer 132 is formed over the dielectric layer 130. In some embodiments, openings are formed in the second conductive layer 132 by photolithography and etching processes. Conductive materials are filled into the openings to form a via 131 and the second conductive layer 132. The second conductive layer 132 is electrically connected to the first conductive layer 113 through the via 131. In some embodiments, another dielectric layer 134 is formed on the dielectric layer 130 and encapsulates the second conductive layer 132. A semiconductor structure 1 is thus completed.

In some embodiments, the first conductive layer 113, the via 131 and the second conductive layer 132 constitute a spiral structure. The magnetic layer 128 and the etch stop stack 120 formed by the process described in FIGS. 2A-2F is disposed in a central portion of the semiconductor structure 1 and surrounded by the spiral structure.

In some embodiments, the etch stop layer at least includes a plurality of Ta layers and a plurality of TaO layer. The etch stop layer is formed between the magnetic layer and the dielectric layer (for example. the dielectric layer 115) covering a portion of the first conductive layer, and thus the etch stop layer protects the dielectric layer from being damaged by the etchant used in the etching process of the magnetic layer. Accordingly, the delamination of the dielectric layer from the first conductive layer, the crack of the dielectric layer, the pull back of another dielectric layer (for example. the dielectric layer 130) covering the magnetic layer and bubble defect are reduced, and the reliability of the semiconductor device is improved.

In accordance with some embodiments of the present disclosure, a semiconductor device includes a conductive layer, a first dielectric layer, a magnetic layer and an etch stop stack. The first dielectric layer is disposed over the conductive layer. The magnetic layer is disposed over the first dielectric layer. The etch stop stack is disposed between the magnetic layer and the first dielectric layer and includes a plurality of tantalum layers and a plurality of tantalum oxide layers.

In accordance with alternative embodiments of the present disclosure, a semiconductor device includes a conductive layer, a first dielectric layer, a magnetic layer and an etch stop stack. The first dielectric layer is disposed over the conductive layer. The magnetic layer is disposed over the first dielectric layer. The etch stop stack is disposed between the magnetic layer and the first dielectric layer. The etch stop stack includes a second dielectric layer and a plurality of unit layers between the second dielectric layer and the magnetic layer, and each of the plurality of unit layers comprises a tantalum layer and a tantalum oxide layer on the tantalum layer.

In accordance with yet alternative embodiments of the present disclosure, a method of forming a semiconductor device includes at least the following steps. A first dielectric layer is formed over a conductive layer. An etch stop stack is formed over the first dielectric layer, and the etch stop stack includes a plurality of tantalum layers and a plurality of tantalum oxide layers. A magnetic layer is formed over the etch stop stack. A portion of the magnetic layer is removed while the etch stop stack covers the first dielectric layer and the conductive layer. A portion of the etch stop stack is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a conductive layer;
a first dielectric layer disposed over the conductive layer;
a magnetic layer disposed over the first dielectric layer; and
an etch stop stack disposed between the magnetic layer and the first dielectric layer, the etch stop stack comprising a plurality of tantalum layers and a plurality of tantalum oxide layers.

2. The semiconductor device of claim 1, wherein the plurality of tantalum layers and the plurality of tantalum oxide layers are alternatively arranged.

3. The semiconductor device of claim 1, wherein the etch stop stack further comprises a second dielectric layer between the first dielectric layer and the plurality of tantalum layers and the plurality of tantalum oxide layer.

4. The semiconductor device of claim 3, wherein one of the plurality of tantalum layers is contact with the second dielectric layer and one of the plurality of tantalum oxide layers is contact with the magnetic layer.

5. A semiconductor device, comprising:
a conductive layer;
a first dielectric layer disposed over the conductive layer;
a magnetic layer disposed over the first dielectric layer; and
an etch stop stack disposed between the magnetic layer and the first dielectric layer, including a second dielectric layer and a plurality of unit layers between the second dielectric layer and the magnetic layer, wherein each of the plurality of unit layers comprises a tantalum layer and a tantalum oxide layer on the tantalum layer.

6. The semiconductor device of claim 5, wherein the magnetic layer comprises a magnetic metal material containing Co, Zr, Ta, Nb, Re, Nd, Pr, Dy or a combination thereof.

7. The semiconductor device of claim 5, wherein the second dielectric layer comprises silicon nitride, silicon carbide, nitrogen-doped silicon carbide, silicon oxynitride, oxygen-doped silicon carbide, silicon oxide, nitrogen-oxide-nitrogen (NON), oxide-nitrogen-oxide (ONO) or a combination thereof.

8. The semiconductor device of claim 5, wherein a thickness ratio of the tantalum layer and the tantalum oxide layer ranges from about 1:1 to 4:1.

9. The semiconductor device of claim 5, wherein a total thickness of the plurality of unit layers ranges from about 100 angstroms to 600 angstroms.

10. The semiconductor device of claim 5, wherein a thickness of the second dielectric layer ranges from about 1000 angstroms to 5000 angstroms.

11. The semiconductor device of claim 5, further comprising a third dielectric layer covering the first dielectric layer, the magnetic layer and the etch stop stack, wherein the first and third dielectric layers partially expose the conductive layer.

12. The semiconductor device of claim 5, wherein an included angle between a bottom surface and a sidewall of the plurality of unit layers ranges from about 10 degrees to 60 degrees.

13. The semiconductor device of claim 5, wherein an included angle between a bottom surface and a sidewall of the second dielectric layer ranges from about 20 degrees to 90 degrees.

14. A method of forming a semiconductor device, comprising:
forming a first dielectric layer over a conductive layer;
forming an etch stop stack over the first dielectric layer, wherein the etch stop stack comprises a plurality of tantalum layers and a plurality of tantalum oxide layers;
forming a magnetic layer over the etch stop stack;
removing a portion of the magnetic layer while the etch stop stack covers the first dielectric layer and the conductive layer; and
removing a portion of the etch stop stack.

15. The method of claim 14, wherein the magnetic layer is partially removed by a wet etch process.

16. The method of claim 14, wherein the etch stop stack is partially removed by a dry etch process.

17. The method of claim 14, wherein the etch stop stack is formed by forming a second dielectric layer and a plurality of unit layers, wherein each of the plurality of unit layers comprises the tantalum layer and the tantalum oxide layer on the tantalum layer.

18. The method of claim 17, wherein forming the plurality of unit layers includes performing a plurality of cycles, and each cycle comprises forming the tantalum layer and performing an oxidation process on the tantalum layer to form the tantalum oxide layer.

19. The method of claim 14, further comprising forming a third dielectric layer over the first dielectric layer to cover the magnetic layer and the etch stop stack and expose a portion of the conductive layer.

20. The method of claim 14, wherein the etch stop stack is partially removed by using the magnetic layer as a mask.

* * * * *